United States Patent
Nakada et al.

(10) Patent No.: US 6,713,761 B2
(45) Date of Patent: Mar. 30, 2004

(54) SCANNING ELECTRON MICROSCOPE

(75) Inventors: Yoshinori Nakada, Hitachinaka (JP); Shunsuke Koshihara, Hitachinaka (JP); Ryuichirou Tamochi, Hitachinaka (JP); Yayoi Hosoya, Mito (JP); Hidetoshi Morokuma, Hitachinaka (JP)

(73) Assignees: Hitachi, Ltd., Tokyo (JP); Hitachi Science Systems, Ltd., Tokyo (JP)

( * ) Notice: Subject to any disclaimer, the term of this patent is extended or adjusted under 35 U.S.C. 154(b) by 149 days.

(21) Appl. No.: 09/863,346

(22) Filed: May 24, 2001

(65) Prior Publication Data

US 2001/0054692 A1 Dec. 27, 2001

(30) Foreign Application Priority Data

May 29, 2000 (JP) .......................... 2000-159062

(51) Int. Cl.[7] ............................................... H01J 37/00
(52) U.S. Cl. ..................................................... 250/310
(58) Field of Search ............................. 250/442.11, 310

(56) References Cited

U.S. PATENT DOCUMENTS

| 5,153,444 A | | 10/1992 | Maeda et al. | |
| 5,512,747 A | * | 4/1996 | Maeda | 250/310 |
| 5,777,327 A | * | 7/1998 | Mizuno | 250/310 |
| 5,801,382 A | * | 9/1998 | Noda et al. | 250/310 |
| 5,905,650 A | | 5/1999 | Tsutsui et al. | |
| 6,169,282 B1 | * | 1/2001 | Maeda et al. | 250/310 |

FOREIGN PATENT DOCUMENTS

| JP | 9-139406 | 5/1997 |
| JP | 10-267993 | 10/1998 |
| JP | 10-340935 | 12/1998 |
| JP | 11-167893 | 6/1999 |

\* cited by examiner

*Primary Examiner*—Kiet T. Nguyen
(74) *Attorney, Agent, or Firm*—Dickstein Shapiro Morin & Oshinsky LLP

(57) ABSTRACT

In order to provide a full-automatic scanning electron microscope which carries out investigation jobs full-automatically from fine adjustment to reviewing, the scanning electron microscope of the present invention has a function of calculating the accuracy of correction after correction of coordinates and displaying it with vectors 39, a function of automatically determining a searching magnification for automatic object detection from the obtained information after correction of coordinates, and a function of calculating the frequency of occurrence of objects or defects and a time required for measurement from the searching magnification and conditions of measurement.

8 Claims, 8 Drawing Sheets

OBSERVABLE OBJECT SIZES AND VIEW FIELD SIES

OBSERVABLE OBJECT SIZES AND MAGNIFICATIONS

FREQUENCY OF OCCURRENCE BY
SPECIFICATION OF OBJECT SIZES

SCANNING ELECTRON MICROSCOPE

BACKGROUND OF THE INVENTION

This invention relates to a scanning electron microscope (SEM) which can observe minute objects on the surface of a specimen.

A scanning electron microscope (SEM) scans a specimen with electron beams, detects secondary electrons emitted from the specimen as the result of bombardment by electron beams, and displays a secondary electron image representing the scanned objects on a display screen. This technology is also used for observation of minute structures in semiconductor manufacturing fields. Recently, as semiconductor devices have quickly become smaller and smaller, objects and defects on specimens have also become much smaller. They are too small to be searched and detected by conventional optical object/defect investigating devices and the like. Their resolutions have almost reached the limits of searches and observations of objects and defects. In production of such minute semiconductor devices, foreign objects and defects of micro sizes on silicone wafers may cause errors and problems. Further each silicone wafer has a lot of objects and defects to be observed (e.g. some tens to some hundreds. For detailed investigation of these objects and defects, the semiconductor manufacturers have been longing for means for automatic observation and investigation which combine an Auto Defect Review (ADR) function by a scanning electron microscope (SEM) and an Auto Defect Classification (ADC) function which automatically classifies objects and defects detected by the ADR function.

Usually to observe such minute objects and defects, the SEM takes the steps of locating objects and defects on each wafer in advance by another inspection system, searching and observing them according to the coordinate data of their positions. However, substantially, there is a slight difference between the coordinates system of the inspection system and the coordinates system of the SEM and this difference (error) is one of the factors which prevent automation of investigation of objects and defects by the SEM. Usually, the SEM magnifies the secondary electron image of objects and defects of submicron sizes by at least 5000 times to display it on the screen of the SEM. Naturally, the size of the SEM screen is limited and the area you can investigate at a time is also limited. Therefore, if the positional data of an object or defect obtained by the inspection system contains a large error, the image of the object or defect may not be In the SEM screen. For example, you can observe an area of only 40 $\mu$m square at a time on the SEM screen of 200 mm square at a magnification of ×5000. If the object/defect coordinate data obtained by the inspection system contains an error of ±20 $\mu$m or more, the image of the object/defect is not in the screen area and you cannot find it.

One of methods to solve the above problem comprises the steps of obtaining coordinate data of objects or defects of known sizes on a test specimen by an inspection system, obtaining the coordinate data of the objects or defects on the test specimen in the SEM coordinates system, determining a coordinate converting expression to minimize their coordinate difference, and using this expression for fine positional adjustment. However, if the correction is made by objects or defects which are selected at random, the correction values may be various and the result of correction will not always be assured. To solve such as problem, Japanese Non-examined Patent Publications H11-167893 (1999) (titled "Scanning electron microscope") discloses a method of automatically re-calculating a coordinate converting expression using only objects or defects close to a new position on a wafer when the wafer is moved. This method is expected to give a high accuracy of correcting coordinates because objects or defects which are close to each other have a very similar coordinate error.

However, there is no means to check whether the coordinates are corrected to the expected frequency of occurrence of objects (assuming that all objects on the screen can be detected by the ADR). If the frequency of occurrence was low in an actual automatic measurement, the operator had to increase points of measurement for fine adjustment, increase the accuracy of correction of coordinates, and measure again. If an error of some tens micrometers is corrected down to some micrometers, objects and defects can be caught for observation. However, for accurate classification of objects and defects, images of a higher magnification are required. A typical manual detection of an object or defect after correction of coordinates by a fine adjustment comprises the steps of observing the specimen for an object or defect at a low magnification, moving the object or defect to the center of the screen, and increasing the magnification. An automatic object/defect detecting method comprises the following steps:

Measuring the locations of an object or defect on a wafer in advance by the other inspection system, moving the stage to the position of the object or defect according to the coordinate data obtained by the measurement, taking an image of the area including the object or defect at a preset low magnification (for searching), comparing this image by a normal pattern image which was obtained at the same magnification in advance, and thus detecting the object or defect. For investigation of objects or defects on a patterned wafer, the above detecting method further comprises the steps of taking an image of a pattern element (called "die") next to the pattern element including this object or defect at the same coordinates, comparing these images, moving the stage until the object or defect comes to the center of the screen, and shooting the object or defect at a preset high magnification.

SUMMARY OF THE INVENTION

In the above automatic detection, the setting of a searching is greatly restricted by a coordinate error. As the searching magnification is higher, the accuracy of detection of objects and defects can be higher. However, if the coordinate error is great, the objects and defects may not be in the screen field. Therefore, the operator had to move the stage to the coordinates corrected from measurement of some objects or defects after fine adjustment, set the searching magnification from the center of the stage and the actual position of the object or defect or the operator had to set a low searching magnification. In either case, the magnification to be set is dependent upon operator's experience, skills, and so on and the final frequency of occurrence of objects or defects may also be affected. An object of the present invention is to provide a scanning electron microscope which can full-automatically search and classify objects and faults on a specimen without conventional technical faults.

To attain the above object, the scanning electron microscope of the present invention has a function for calculating the accuracy of correction of a coordinate correcting expression used for fine adjustment of linkage of coordinates when the scanning electron microscope automatically observes objects or defects on a specimen with electron beams and displays thereof for example by vectors; means for automatically detecting and storing information of coordinates of objects and defects fit to be used by a coordinate error calculating means; a function for automatically determining, from said information, a searching magnification which is used to automatically detect objects or defects after coordinate correction; and a function for calculating a frequency of occurrence of objects or defects and a required time from said searching magnification and conditions of measurement.

Further, the scanning electron microscope of the present invention has a function for displaying coordinate errors before correction by fine adjustment with vectors and a function for automatically determining, from said information, a searching magnification which is used to automatically detect objects or defects without a coordinate correction and calculating a frequency of occurrence of objects or defects and a required time. In other words, the scanning electron microscope of the present invention has a stage which moves with a specimen on it and a function for moving the stage to a corrected coordinate value which is obtained by correcting the coordinates of an object/defect of interest on said specimen which was obtained by the other inspection system. The scanning electron microscope further has a function for calculating the accuracy of correction of the coordinate correcting expression from said coordinate values and values of coordinates at which the object or defect of interest is observed.

The coordinate correcting expression can be made to minimize the difference between coordinate values of some objects of interest on said specimen which was by the other inspection system and coordinate values in the coordinate system of the stage. Further the coordinate correcting expression can be made to convert coordinates of some pre-selected points on a specimen into coordinates in the coordinate system of the stage for measurement in the coordinate system of the stage. The correction accuracy data is used in various ways. For example, the data is stored in a numeric table or displayed using vectors. It is preferable that the scanning electron microscope of the present invention has a function for visually showing the accuracy of correction on the position of a point of interest by displaying a vector equivalent to a difference between a position vector which represents coordinates at which the point of interest is actually observed and a position vector representing the corrected coordinates.

The other device can be an inspection system. The object to be observed is a foreign object or defect on the surface of a specimen. In the present invention, said object to be observed is a foreign object or defect. Judging from the accuracy of correction and the size of the observed object or defect, it is preferable that the scanning electron microscope has a function for automatically determining a searching magnification at which an object or defect on the stage at the corrected coordinates is automatically detected. Further, it is preferable that the scanning electron microscope of the present invention has a function for calculating the frequency of occurrence of objects or defects which are automatically detected at the determined magnification.

Further, it is preferable that the scanning electron microscope of the present invention has a function for calculating a time for measurement from the calculated frequency of occurrence, a condition of measurement, and the number of objects or defects. This condition of measurement contains auto-focusing condition, the number of frames which are added to an image to increase the S/N ratio, etc. The present invention can provide a scanning electron microscope which can properly correct a coordinate error between devices and automatically perform investigation jobs from defect searching to reviewing.

DETAILED DESCRIPTION OF THE PREFERRED EMBODIMENTS

Figure 1:
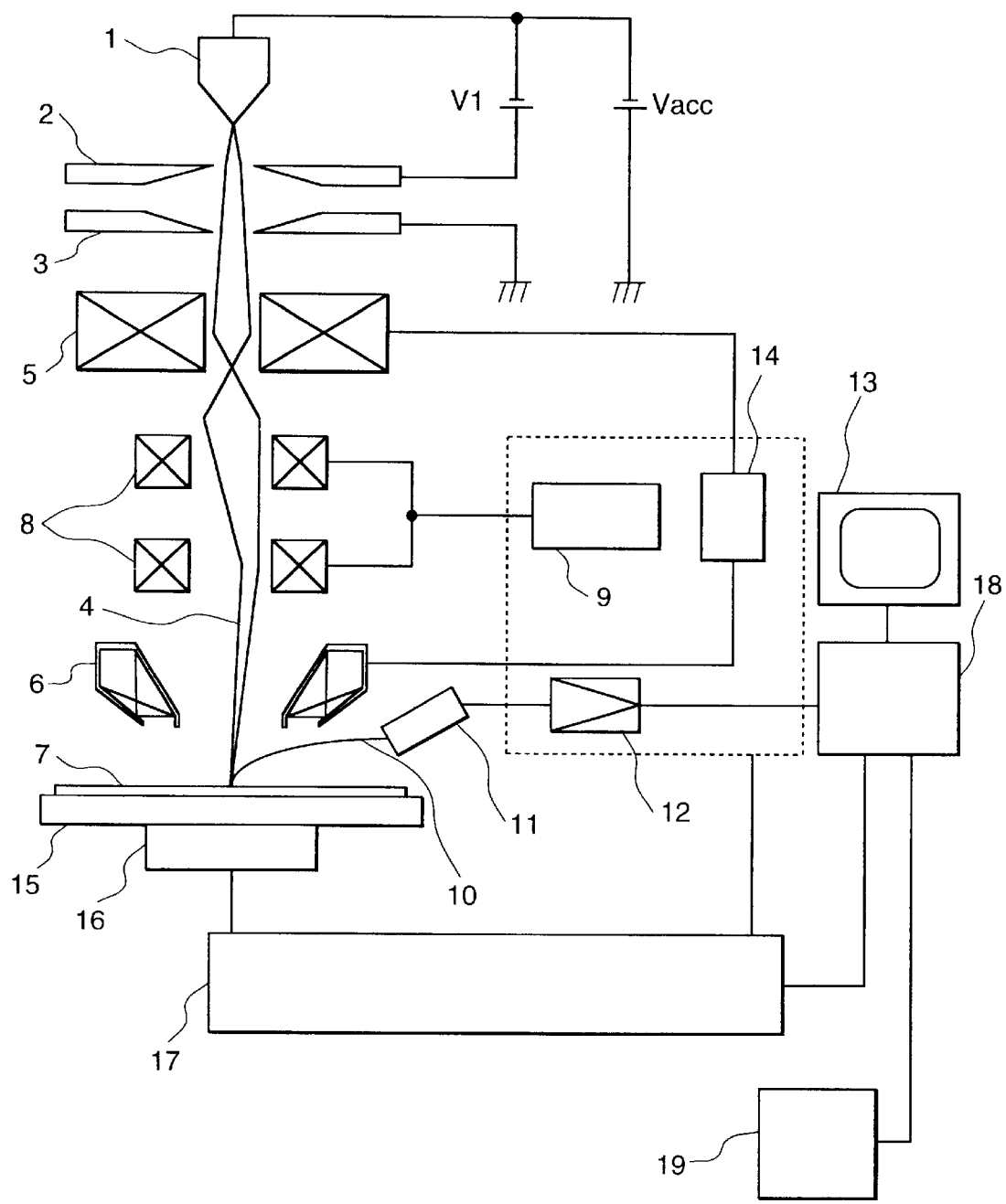
FIG. 1 is an example of configuration of a scanning electron microscope in accordance with the present invention.

The present invention will be described in detail below, referring to the accompanying drawings. The example below automatically detects objects or defects on a semiconductor specimen. FIG. 1 is an example of configuration of a scanning electron microscope (SEM) in accordance with the present invention. A voltage V1 is applied between a cathode 1 and a primary anode 2 to generate a primary electron beam 4. The primary electron beam 4 is accelerated by a voltage Vacc which is applied to a secondary anode 3 and enters the succeeding lens system. The primary electron beam 4 is condensed to a micro spot on a wafer (specimen) held on a specimen holder 15 by a condenser lens 5 and an objective lens 6 which are controlled by a lens control power supply 14. The two deflecting coils 8 cause the micro spot to scan the wafer (specimen) 7 two-dimensionally. The stage 16 moves the specimen holder 15 by control signals from a control means 17 to change scan areas of the wafer (specimen) 7 to be scanned by electron beams 4. The scanning signals fed to the deflecting coils 8 are controlled by a deflection control means 9 according to the observation magnification. A secondary electron detector 11 detects the secondary electrons 10 generated from the specimen by the primary electron beam 10 which is scanning the wafer (specimen) 7 and sends its information to an amplifier 12. The amplified secondary electron information is processed by a computer 18 and displayed on a display unit such as a CRT 13.

The scanning electron microscope of the present invention corrects object/defect coordinate information sent from an inspection system 19 into optimum values by a computer 18 according to information pertaining to the position of the specimen holder 15 and information pertaining to the positions of objects or defects displayed on the CRT 13 and determines a searching magnification (at which objects or defects are automatically detected) from the corrected values. With this, the scanning electron microscope can automatically perform investigation jobs from defect searching to reviewing.

Figure 2:
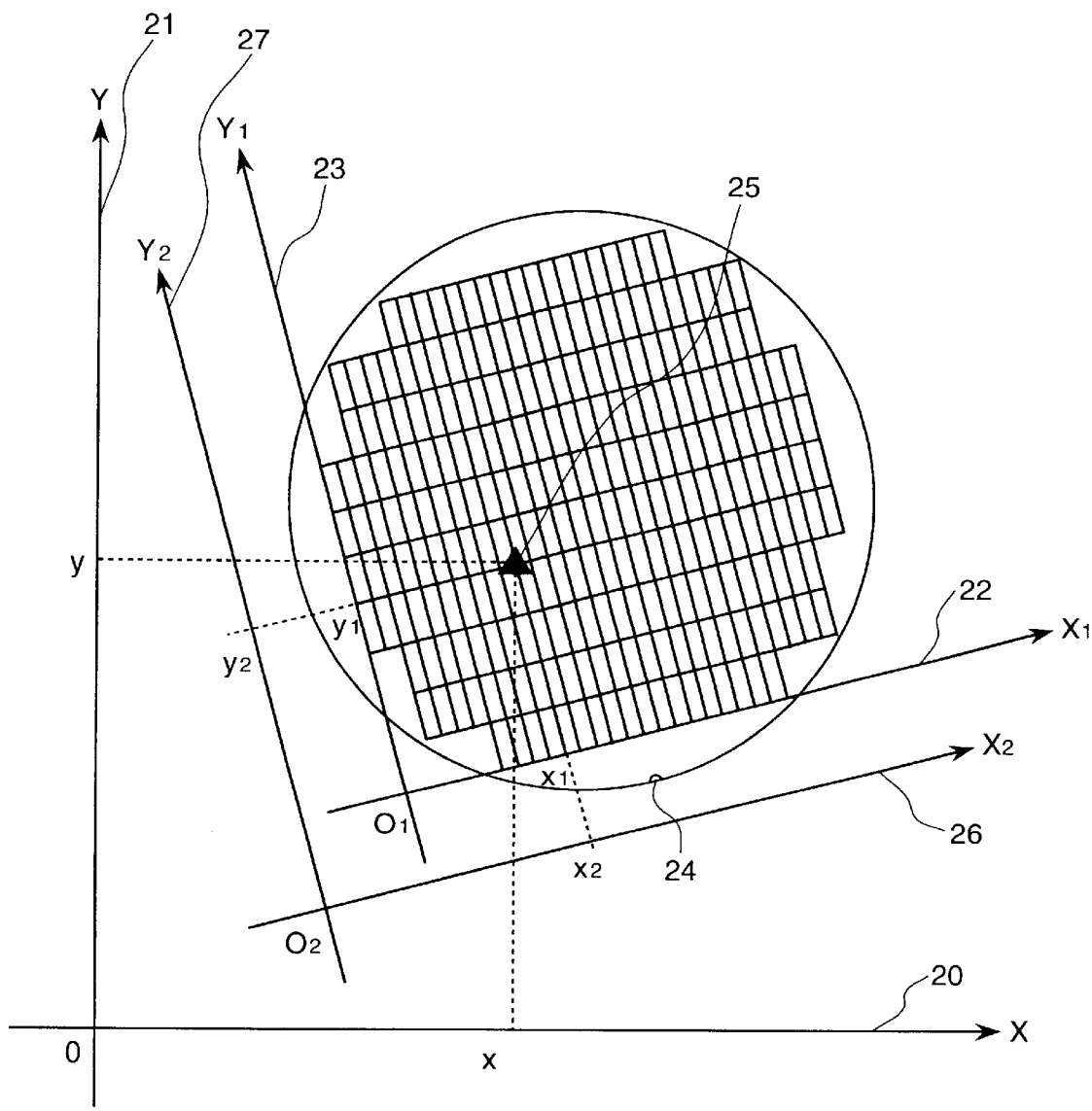
FIG. 2 shows a relationship between the wafer coordinates system and the stage coordinates system.

FIG. 2 shows a relationship between the wafer coordinates system and the stage coordinates system. The stage coordinates system is a coordinates system specific to the scanning electron microscope. The coordinates 20 and 21 of the stage coordinates system of this embodiment are drawn through a fixed point 0 of the moving stage 16. The coordinates system is always fixed independently of the position and shape of a wafer (specimen) and will not be affected by the result of coordinate conversion. However, the other devices cannot use values of coordinates obtained by the stage coordinates system because the stage coordinates system is specific to the scanning electron microscope.

Contrarily, the wafer coordinates system is wafer-specific coordinates system. In other words, the system is determined by the profile of a wafer when the wafer is not patterned or by a pattern element on a wafer when the wafer is patterned. In this embodiment, a wafer is aligned with its V-notch 24 at the bottom. The $X_1$ axis 22 of the wafer coordinates system is a line drawn on the bottom sides of the lowermost pattern elements of the wafer and the $Y_1$, axis 23 of the wafer coordinates system is a line drawn on the left sides of the leftmost pattern elements of the wafer. Therefore, this wafer can provide an identical coordinates system even in different testing devices. Theoretically, you can use the data of coordinates in the wafer coordinates system to observe objects and defects on wafers.

In reality, however, every device has its own margin of error which must be corrected. When the offset of the origin O is corrected, the X and Y axes of the wafer coordinates system moves in parallel from $X_1$ to $X_2$ and $Y_1$ to $Y_2$. In other words, the coordinates $(x_1, y_2)$ of an object 25 in the wafer coordinates system change to coordinates $(x_2, y_2)$ by this coordinate conversion. Contrarily, the coordinates of the object 25 in the stage coordinates system are not affected by the coordinate conversion and remain at (x, y). Therefore, when registering the coordinates of a detected object or defect, it is necessary to register both the coordinates in the wafer coordinates system before a coordinate correction and the coordinates in the wafer coordinates system after a coordinate correction and to register the coordinates in the stage coordinates system. This function can be realized for example by software in the computer 18.

Figure 3:
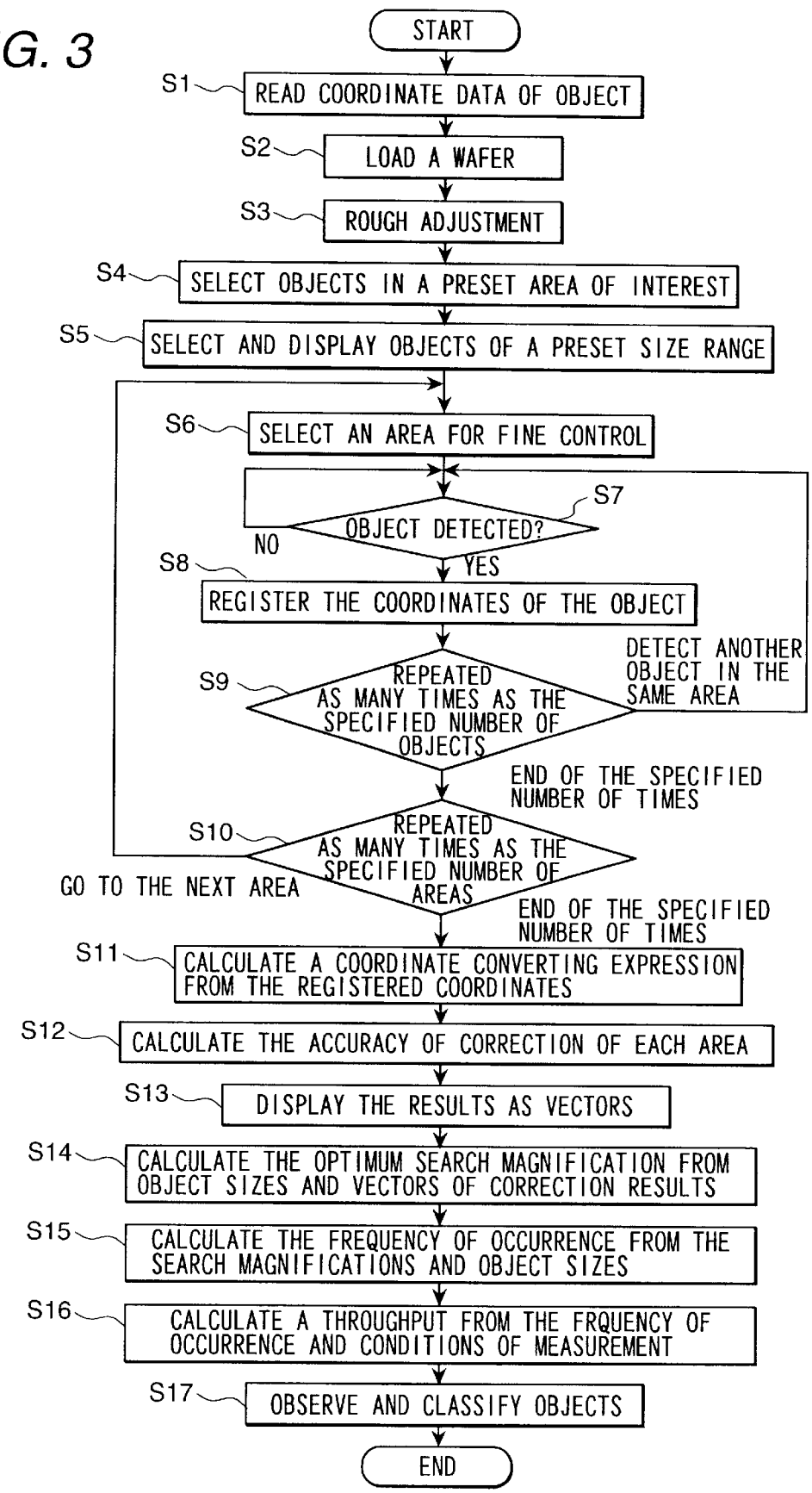
FIG. 3 shows a process flow of automatic fault detection by a scanning electron microscope (SEM).

FIG. 3 shows a process flow of automatic semiconductor fault detection by a scanning electron microscope (SEM). In preparation for step 1 of FIG. 3, objects (or defects) on a wafer are located by an inspection system. The positions of the objects are basically represented by the wafer coordinates system which is the same as that of the SEM. However, in general, there is a subtle difference (error) between the coordinates system of the inspection system and the coordinates system of the SEM.

In step 1, data of object coordinates obtained by the inspection system 19 is transferred in a recording medium such as a floppy disk or through a network from the inspection system 19 to the SEM. (At the same time, information about object sizes is also transferred.) In step 2, the SEM loads a wafer 7 which was already tested by the inspection system 19. These steps 1 and 2 can be reversed. In step 3 (Rough adjustment of linkage of coordinates), the coordinates of two or more preset points on the wafer 7 are measured in the stage coordinates system. The operator checks how the wafer is located (or situated) in the stage coordinates system from the coordinates.

Figure 4:
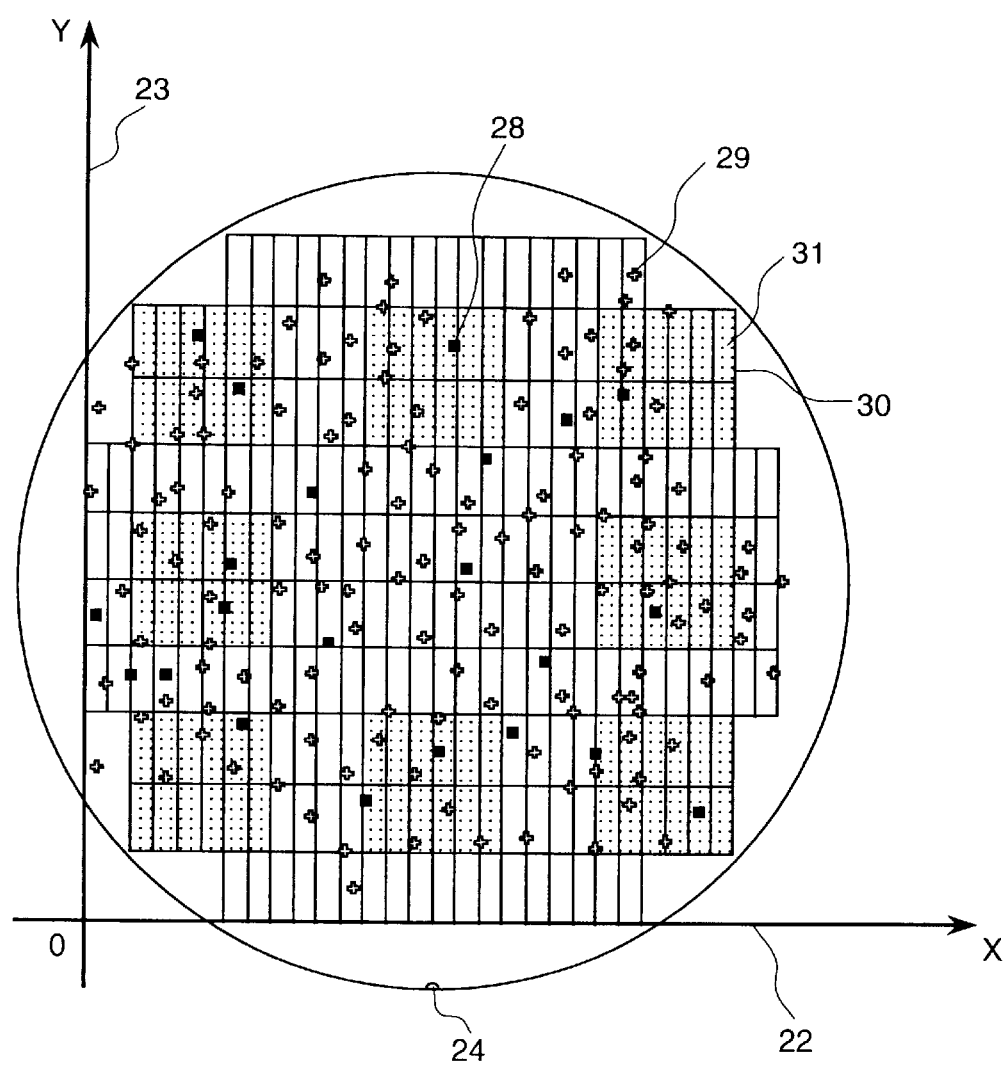
FIG. 4 shows an example of selecting an object or defect to be registered.

FIG. 4 shows how a point is selected for a fine adjustment. FIG. 4 shows a wafer coordinate system containing object/defect data 29, pattern elements 31 and areas 30 whose object/defect is automatically selected for fine adjustment. This is displayed on the CRT 13, using wafer design data and object/defect data sent from the inspection system.

In step 5, the SEM detects an object 28 (whose size is specified in advance by a recipe or the like) of a size fit for fine adjustment and gives it a proper color or symbol (mark "■" in FIG. 4) to identify it from other objects. In this case, the size information is sent together with coordinate data to the SEM from the inspection system. The number, sizes, and positions of areas 30 which are hatched in FIG. 4 are specified in advance and they should be specified freely. The operator can easily specify each area by entering numeric values, entering pattern element numbers, dragging the mouse pointer, or the like when creating a recipe. The setting of each area should be stored (or registered) individually. By changing these registered settings, adequate areas can be selected automatically on wafers having different object/defect distributions.

Figure 5:
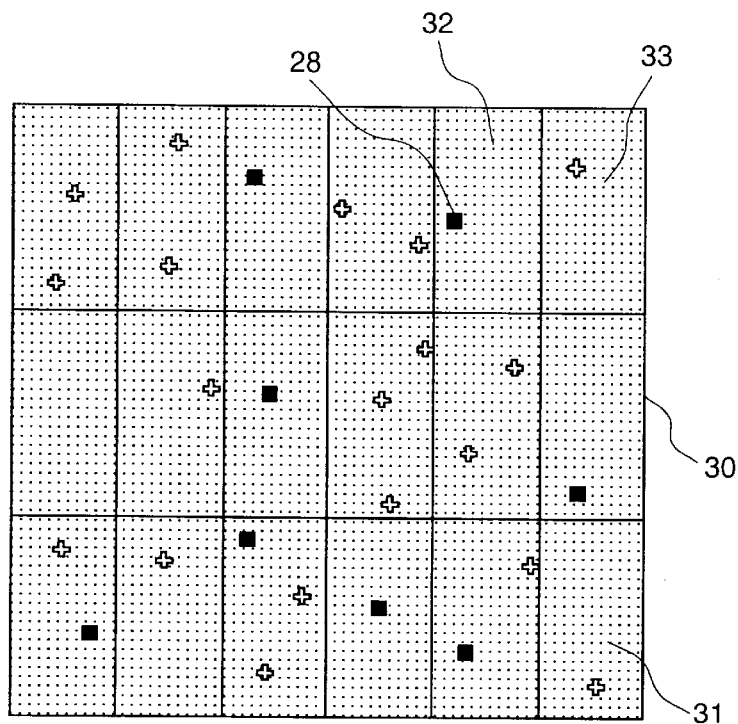
FIG. 5 is a conceptual illustration of objects or defects on a semiconductor wafer.

In step 6, the SEM moves the stage 16 to a selected area 30 to detect an object for fine adjustment. In step 7, the SEM detects an object or defect. That is, in step 7, the SEM selects an object for fine adjustment among objects 28 of a size fit for fine adjustment which are selected in step 5 and detects objects in the similar manner as the automatic object/defect detection. As shown in FIG. 5, to detect an object 28 in the pattern element 32, the SEM moves to the corresponding point (coordinates) in an adjoining pattern element 33, gets a reference image, moves to the pattern element 32, gets a comparison image, compares these images, and thus identify an object. In step 8, the SEM registers a pair of coordinates of the detected object in the SEM stage coordinates system and the coordinates detected by the inspection system. When coordinates of two or more objects in an area are registered, the step 8 is repeated as many times as the number of the registered objects or defects. To register coordinates of objects in two or more areas, go back to step 6, and repeat the step 6 to step 10 s many times as the preset number of areas.

In step 11, the SEM determines constants for a means for calculating coordinate errors between devices from the registered coordinates (values) and generates an expression adequate for coordinate conversion. For example, if the main factors of a coordinate error are an origin offset (a, b), a rotating error "β," dimensional accuracy errors "m" and "n" of X- and Y-axes, and a perpendicularity error "α" of the orthogonal axes, the coordinate converting expression can be $$\begin{pmatrix} x \\ y \end{pmatrix} = \begin{pmatrix} m(\cos\beta + \sin\beta\tan\alpha) - \dfrac{n\sin\beta}{\cos\alpha} \\ m(\sin\beta - \cos\beta\tan\alpha)n\cos\dfrac{\beta}{\cos\alpha} \end{pmatrix} \begin{pmatrix} x_1 \\ y_1 \end{pmatrix} + \begin{pmatrix} a \\ b \end{pmatrix} \quad \text{[Formula 1]}$$

wherein ($x_1$, $y_1$): Coordinates of an object measured by the inspection system (x, y): Coordinates of an object converted for the SEM coordinates system (a, b): Error of the coordinate origin of the inspection system m: Dimensional accuracy error of the X-axis n: Dimensional accuracy error of the Y-axis α: Perpendicularity error of coordinates of the inspection system β: Angular error between coordinate axes The parameters "a," "b," "m," "n," "α," and "β," are determined by a method of least squares so that the coordinates $(x_1, Y_1)$ of an object measured by the inspection system may be as equal to the coordinates (x, y) of an object converted for the SEM coordinates system as possible. The resulting coordinate converting expression is used to correct the coordinates sent from the inspection system to those for the SEM. This correction can be for example by software in the computer 19.

Figure 6:
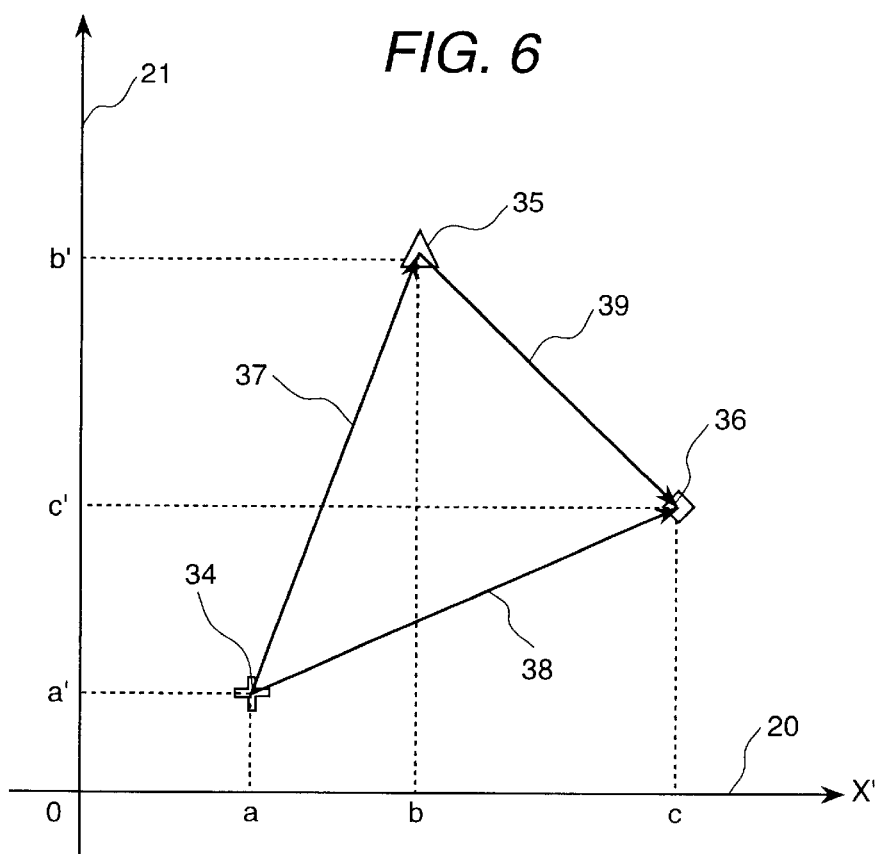
FIG. 6 shows a sample method of calculating a vector representing the accuracy of correction.

In step 12, the accuracy of correction is calculated. FIG. 6 shows a sample method of obtaining a vector representing the accuracy of correction. In the stage coordinates system (X-0-Y) of the SEM, the coordinates 34 of an object sent from the inspection system is converted to the object coordinates 35 after coordinate conversion by the coordinate converting expression which is generated in step 11. The object coordinates 36 is an actual object coordinates which are registered as the coordinates of an object selected for fine adjustment. It is ideal that the object coordinates 35 after coordinates conversion is equal to the actual object coordinates 36, that is, b=c and b'=c'. However, these coordinates 35 and 36 are not always the same because the coordinate errors of the SEM and the inspection system do not have any regularity. Therefore, the present invention uses, as a correction accuracy vector 39, a difference between a corrected coordinate vector 37 calculated by the coordinate correcting expression (which is generated in step 11) and the actual object coordinate error vector 38.

Figure 7:
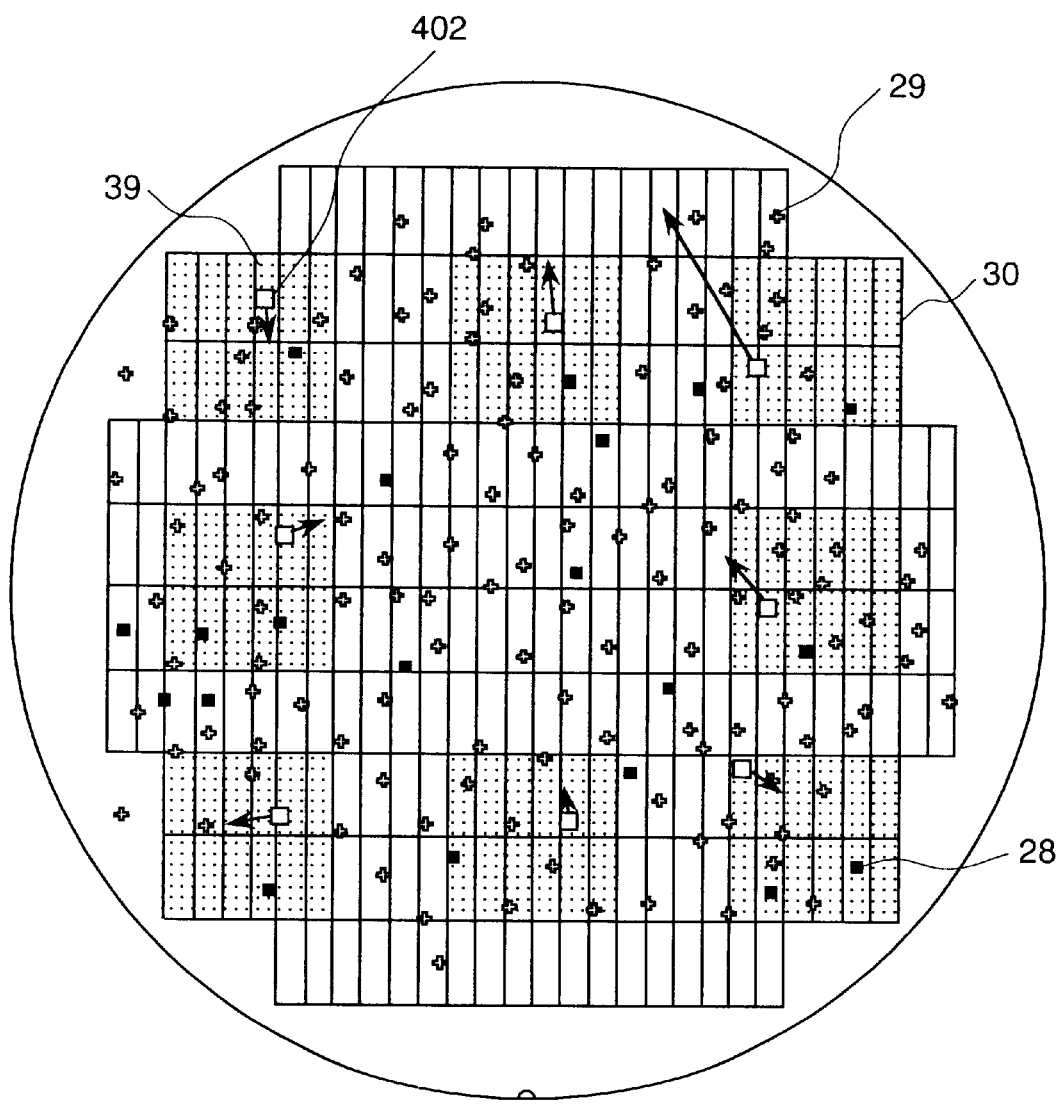
FIG. 7 is an explanatory illustration of vectors representing correction accuracies on the stage coordinates system.

If you require a locally-high accuracy of correction, you can easily select objects having the same coordinate error tendency by switching the display of the correction accuracy vector 39 to the display of the actual object coordinate vector 38 or by displaying them at a time. In step 13, the SEM displays the correction accuracy vectors 39 which are calculated in step 12 on the layout of objects on the wafer as shown in FIG. 7. Each of the white square boxes 40 represents an object used for calculation of the accuracy of correction and an arrow starting from the object represents a correction accuracy vector 39 calculated for the object. With this, you can tell which object has its coordinates registered and the like at a glance. As FIG. 7 visually tells the size and direction of deviation of the corrected coordinates of each selected object, you can know whether the coordinates correcting expression used for conversion of coordinates of objects are adequate (for confirmation of validity of accuracy of correction of object coordinates). In FIG. 7, you can see at a glance that the correction accuracy vector of an object in the upper right area of the wafer is much greater than those of any other objects on the wafer. This kind of information can be used to check whether the coordinate correcting expression for the object in the upper right area of the wafer should be re-calculated by the other expression.

Figure 8:
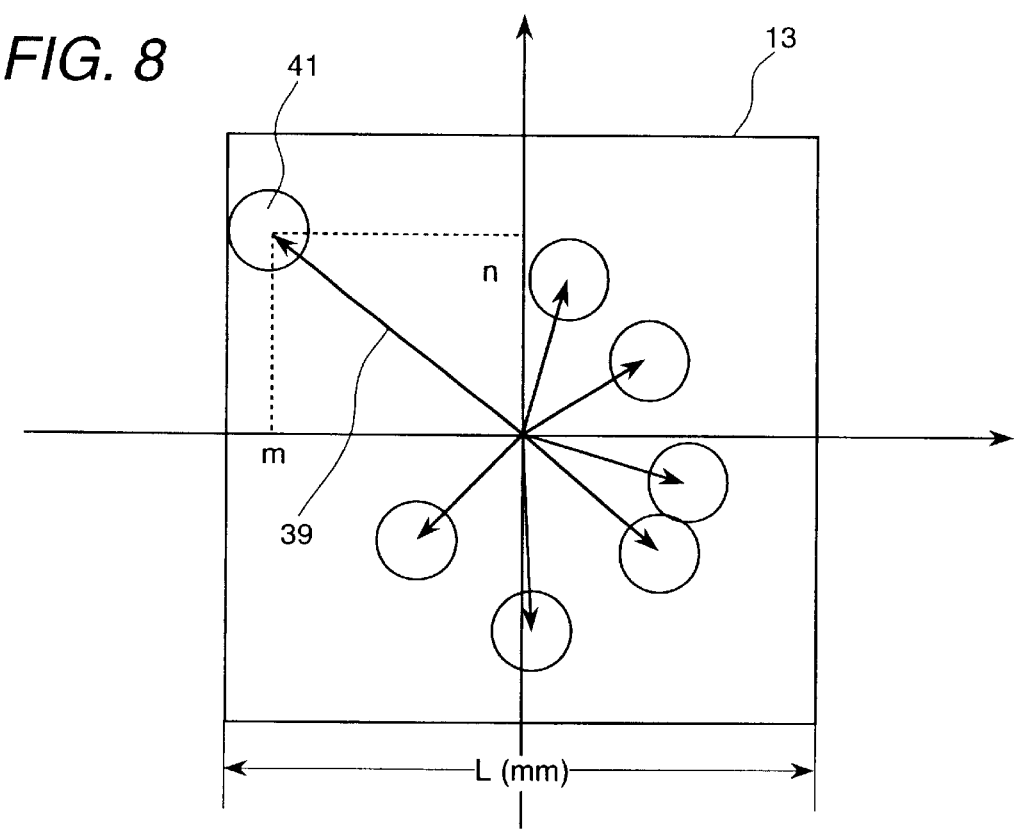
FIG. 8 is an explanatory illustration of a method of calculating an optimum magnification.

In step 14, the SEM calculates a searching magnification for automatic object/defect detection from coordinate correcting expressions of the areas on the wafer (which are calculated in step 12). FIG. 8 shows an example of calculating a searching magnification. This method comprises selecting the greatest one of components of the correction accuracy vectors 39 of the areas, doubling its magnitude, adding the size of a virtual object 41 (an object circle whose diameter is equal to the size of the greatest object or defect to be observed) to the product, and using the resulting length as the length of one side of the screen. The searching magnification is automatically calculated by an expression (Formula 2) shown below. L (mm) in the Formula 2 is the length of one side of the CRT 13.

$$\text{Searching magnification } M = \frac{L(\text{mm}) \times 1000}{\{2 \times (\text{Magnitude of the greatest component}) + \text{Object size}\}\{\mu m\}} \quad [\text{Formula 2}]$$

When a margin for image superimposition is required, the length is added to the denominator of the Formula 2. Similarly a searching magnification for cases without a coordinate correction by a selected object or defect can be obtained by using the actual object coordinate error vector 38.

In step 15, the SEM calculates the frequency of occurrence of objects (assuming that all objects on the screen can be detected by the ADR). If the searching magnification obtained in step 14 is too high, a big object cannot be put in the screen. Contrarily, if the searching magnification is too small, small objects cannot be detected. Therefore, by determining a limit of object detection at each magnification, the frequency of occurrence can be calculated from object size information sent from the inspection system. Further, by using the frequency of occurrence as a parameter to determine a searching magnification, you can calculate a searching magnification.

Figure 9:
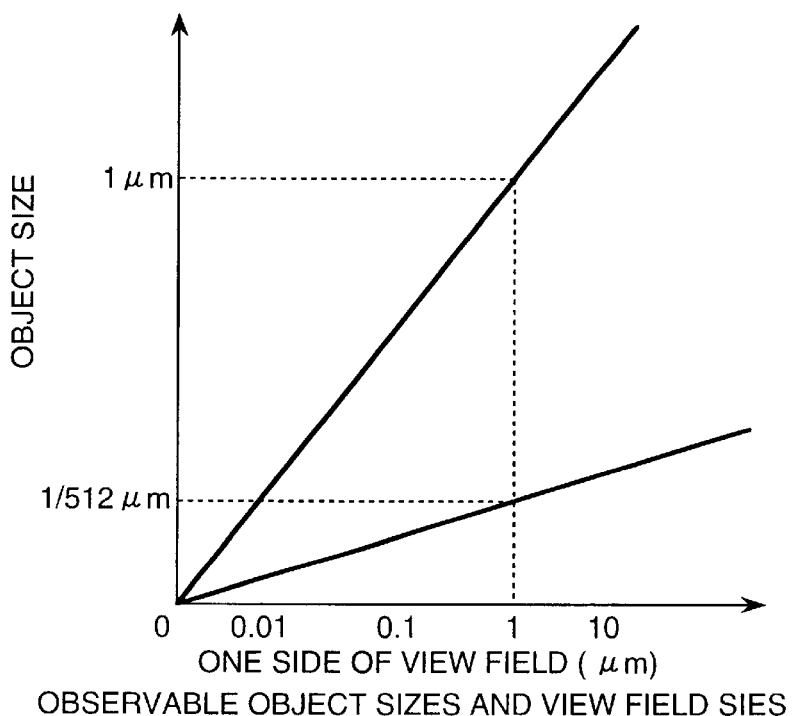
FIG. 9 is an explanatory illustration of a relationship between observable object sizes and field sizes.
Figure 10:
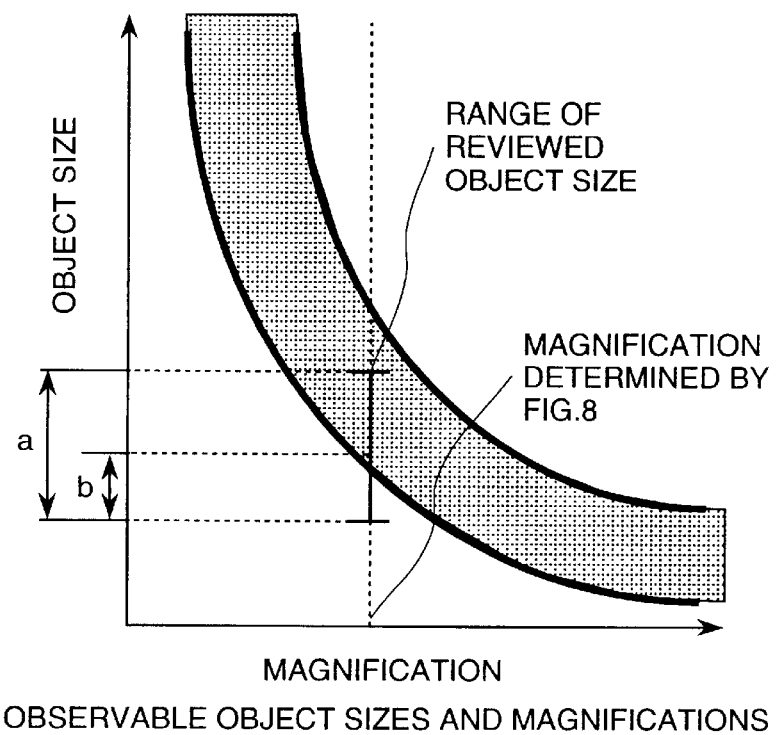
FIG. 10 is an explanatory illustration of a relationship between observable object sizes and magnifications.
Figure 11:
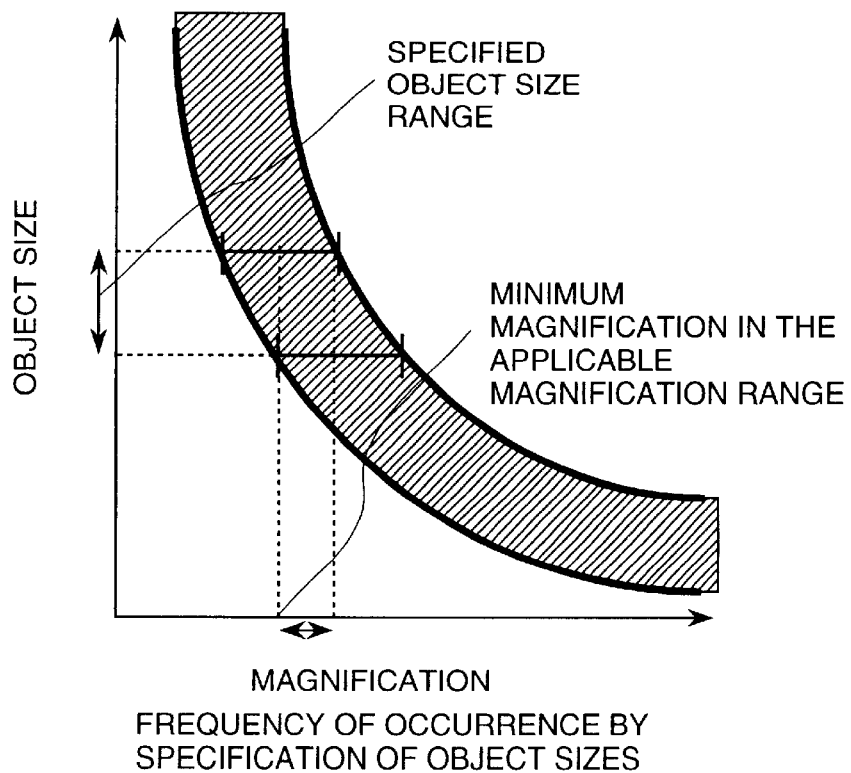
FIG. 11 is an explanatory illustration of the frequency of occurrence of objects by specified object sizes.

FIG. 9 shows the relationship between object sizes and view fields, having detectable object sizes as the Y axis and lengths of one size of the view fields as the X axis. In case the screen for displaying a secondary image is 512 pixels square and the length of one side of the screen corresponds to 1 $\mu$m (at a magnification), the screen (view field) can display an object of up to 1 $\mu$m big. The image of a bigger object overflows the view field. Similarly, the smallest object that can be displayed on the screen is 1 pixel big which is equivalent to $1/512$ $\mu$m. All smaller objects cannot be displayed on the screen. Further, as the length of one side of a view field is dependent upon the magnification and the size of one side of the screen which displays a secondary electron image (see FIG. 8), we can get FIG. 10. FIG. 10 has detectable object sizes as the Y axis and magnifications as the X axis. The hatched part in FIG. 10 represents the range of size of objects detectable at each magnification. FIG. 10 is used as a magnification table to calculate the frequency of occurrence. When a magnification is determined by a method of FIG. 8, an object size that can be detected at the magnification is also determined by this magnification table. In FIG. 10, if the sizes of objects to be observed are in the range "a," objects whose sizes are in the range "b" cannot be detected. The frequency of occurrence of objects is determined by an expression below.

Frequency of occurrence (%)={(Number of objects found on the screen)/(Number of all objects)}×100      [Formula 3]

Further, by first specifying the size of objects you want to observe, the range of magnifications fit for the objects can be determined from this table. In this case, the minimum magnification is the searching magnification for the specified object size. Assuming that the frequency of occurrence of objects at the searching magnification obtained from FIG. 8 is 100%, the frequency of occurrence can be expressed also by Formula 4 from the ratio of view areas at the magnifications. If the frequency of occurrence goes over 100%, it is assumed to be 100% (maximum).

Frequency of occurrence (%)={(View field area at a magnification for a specified object size)/(View field area at a magnification obtained from FIG. 8)}×100      [Formula 4]

The above example sets a minimum object size of 1 pixel at each magnification, but in actual measurement, objects of 3 pixels or smaller cannot be detected because of influences by S/N ratios of images or the like. Therefore, the accuracy of the frequency of occurrence can be increased by including the conditions of measurement and the like in the magnification table. The calculation of the frequency of occurrence in advance offers the following merits:

① It can be an aim for determination of a searching magnification.

② It can enable estimation of a ratio of object detection before actual measurement.

③ It can enable estimation of time required for measurement.

④ It can enable numerization of a conversion accuracy of a coordinate converting expression before actual measurement.

⑤ It can enable numerization of accuracy of linkage of coordinate data between devices. In step 16, the SEM calculates a throughput of measurement from the frequency of occurrence and conditions of measurement such as the number of objects. The throughput is expressed by Formula 5. In the expression below, the time required to detect a single object is a function of stage moving time, image capturing time, and image processing time.

Throughput=Total number of objects×Frequency of occurrence× Time required to detect a single object     [Formula 5]

In step 17, the SEM carries out automatic object/defect detection and automatic object/defect classification in sequence at the searching magnification obtained in step 15.

According to an aspect of the present invention, the scanning electron microscope (SEM) can perform high-accuracy coordinate correction without operator's intervention in automatic investigation of objects or defects on specimens according to coordinates data sent from a inspection system, can automatically set an appropriate searching magnification corresponding to the accuracy of coordinate correction, and carry out observation jobs fully automatically from defect checking to reviewing.

What is claimed is:

1. A scanning electron microscope comprising:
   a cathode
   a scanning deflector for scanning an electron beam generated from said cathode on a specimen;
   an objective lens for converging said electron beam on said specimen;
   a detector for detecting secondary electrons generated from said specimen;
   a display device for displaying an image of said specimen based on an output of said detector;
   a moving stage for moving said specimen; and
   a control device for calculating a corrected coordinate value of objects of interest obtained from another device by using a coordinate correcting expression for correcting an error between a coordinate of said another device and a coordinate of said moving stage, and for moving said moving stage based on said corrected coordinate value, wherein:
   said control device moves said moving stage and adjusts a position of said objects of interest so as to move said objects to an observing position being observed by said electron beam, calculates a vector of misalignment with coordinates of said objects whose position were adjusted, and displays said vector of misalignment on the display device.

2. A scanning electron microscope in accordance with claim 1, wherein said coordinate correcting expression is set to minimize the difference between coordinate values of objects of interest on said specimen which were obtained by another device and coordinate values of said objects in the coordinates system of the stage which are actually observed.

3. A scanning electron microscope in accordance with claim 1, wherein said coordinate correcting expression is to convert the coordinates system on said specimen to the coordinates system on said stage for measurement of coordinate values of some pre-selected points on said specimen in the coordinates system of said stage.

4. A scanning electron microscope in accordance with claim 1, 2, or 3, wherein said scanning electron microscope further comprises a function which calculates a difference vector between a position vector representing coordinates at which said point of interest is actually observed and a position vector representing said corrected coordinates, and displays the equivalent difference vector on the position of said object of interest for visual indication of said accuracy of correction.

5. A scanning electron microscope in accordance with claim 4, wherein said objects of interest are foreign objects or defects on the specimen and said scanning electron microscope further comprises a function which automatically determines a magnification to automatically move said stage to said corrected coordinates and detects foreign objects or defects according to their sizes and said accuracy of correction.

6. A scanning electron microscope in accordance with claim 5, wherein said scanning electron microscope further comprises a function which calculates a frequency of occurrence of objects or defects which are automatically detected at a determined magnification.

7. A scanning electron microscope in accordance with claim 6, wherein said scanning electron microscope further comprises a function which calculates a time period for measurement from the calculated frequency of occurrence, a condition of measurement, and the number of objects or defects.

8. A scanning electron microscope comprising:
   a cathode;
   a scanning deflector for scanning an electron beam generated from said cathode on a specimen;
   an objective lens for converging said electron beam on said specimen;
   a detector for detecting secondary electrons generated from said specimen;
   a display device for displaying an image of said specimen based on an output of said detector;
   a moving stage for moving said specimen; and
   a control device for calculating a corrected coordinate value of objects of interest obtained from another device by using a coordinate correcting expression for correcting an error between a coordinate of said another device and a coordinate of said moving stage, and for moving said moving stage based on said corrected coordinate value, wherein:
   said control device moves said moving stage and adjusts a position of said objects of interest so as to move said objects to an observing position being observed by said electron beam, calculates misalignment with coordinate of said objects whose position were adjusted, and calculates a searching magnification of the electron beam when adjusting said objects.

* * * * *